United States Patent
Guha et al.

(10) Patent No.: US 8,658,501 B2
(45) Date of Patent: Feb. 25, 2014

(54) METHOD AND APPARATUS FOR FLATBAND VOLTAGE TUNING OF HIGH-K FIELD EFFECT TRANSISTORS

(75) Inventors: Supratik Guha, Chappaqua, NY (US); Vijay Narayanan, New York, NY (US); Vamsi K. Paruchuri, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 12/535,383

(22) Filed: Aug. 4, 2009

(65) Prior Publication Data
US 2009/0302370 A1   Dec. 10, 2009

Related U.S. Application Data

(62) Division of application No. 12/133,817, filed on Jun. 5, 2008, now Pat. No. 7,821,081.

(51) Int. Cl.
*H01L 21/8234* (2006.01)

(52) U.S. Cl.
USPC ........... 438/275; 438/216; 438/287; 438/591; 438/763; 438/785

(58) Field of Classification Search
USPC .................. 438/216, 287, 591, 275, 763, 785
See application file for complete search history.

(56) References Cited

U.S. PATENT DOCUMENTS

| | | | |
|---|---|---|---|
| 6,511,876 B2 * | 1/2003 | Buchanan et al. | 438/240 |
| 6,767,847 B1 | 7/2004 | Hu et al. | |
| 7,130,216 B2 | 10/2006 | Bhattacharyya | |
| 7,445,976 B2 * | 11/2008 | Schaeffer et al. | 438/197 |
| 7,504,329 B2 * | 3/2009 | Yu et al. | 438/592 |
| 7,709,359 B2 * | 5/2010 | Boescke et al. | 438/486 |
| 7,713,826 B2 * | 5/2010 | Choi et al. | 438/287 |
| 7,772,073 B2 * | 8/2010 | Clark et al. | 438/287 |
| 7,807,990 B2 * | 10/2010 | Koyama et al. | 257/24 |
| 7,820,552 B2 * | 10/2010 | Kanakasabapathy et al. | 438/704 |
| 7,952,118 B2 * | 5/2011 | Jung et al. | 257/206 |
| 2002/0086504 A1 * | 7/2002 | Park et al. | 438/580 |
| 2004/0071879 A1 * | 4/2004 | Callegari et al. | 427/255.28 |
| 2005/0059172 A1 | 3/2005 | Kim | |
| 2005/0224897 A1 * | 10/2005 | Chen et al. | 257/410 |
| 2005/0282329 A1 * | 12/2005 | Li | 438/216 |
| 2006/0001111 A1 * | 1/2006 | Tsuchiya et al. | 257/410 |
| 2006/0289948 A1 | 12/2006 | Brown et al. | |
| 2007/0001238 A1 | 1/2007 | Koyama et al. | |
| 2007/0082415 A1 * | 4/2007 | Jeon et al. | 438/3 |
| 2007/0111448 A1 * | 5/2007 | Li et al. | 438/264 |
| 2007/0152273 A1 | 7/2007 | Callegari et al. | |
| 2007/0210354 A1 | 9/2007 | Nabatame et al. | |
| 2007/0287199 A1 | 12/2007 | Hsu et al. | |
| 2007/0298569 A1 | 12/2007 | Kim | |
| 2008/0171407 A1 | 7/2008 | Nakabayashi et al. | |
| 2009/0050982 A1 | 2/2009 | Pantisano et al. | |
| 2009/0090971 A1 | 4/2009 | Chang et al. | |
| 2009/0261424 A1 | 10/2009 | Chang et al. | |
| 2009/0263950 A1 * | 10/2009 | Koyama et al. | 438/287 |
| 2009/0283835 A1 | 11/2009 | Yu et al. | |

* cited by examiner

*Primary Examiner* — Bac Au
(74) *Attorney, Agent, or Firm* — Vazken Alexanian

(57) ABSTRACT

In one embodiment, the invention is a method and apparatus for flatband voltage tuning of high-k field effect transistors. One embodiment of a field effect transistor includes a substrate, a high-k dielectric layer deposited on the substrate, a gate electrode deposited on the high-k dielectric layer, and a dipole layer positioned between the substrate and the gate electrode, for shifting the threshold voltage of the field effect transistor.

18 Claims, 1 Drawing Sheet

METHOD AND APPARATUS FOR FLATBAND VOLTAGE TUNING OF HIGH-K FIELD EFFECT TRANSISTORS

CROSS REFERENCE TO RELATED APPLICATIONS

This application is a divisional application of U.S. patent application Ser. No. 12/133,817, filed Jun. 5, 2008, now U.S. Pat. No. 7,821,081, which is herein incorporated by reference in its entirety.

BACKGROUND OF THE INVENTION

The present invention relates generally to high-k field effect transistors, and relates more particularly to flatband voltage tuning of high-k field effect transistors.

Flatband voltage is the voltage at which there is no electrical charge in a semiconductor and, therefore, no voltage drop across the semiconductor (i.e., in a band diagram the energy bands of the semiconductor are horizontal (flat)). Flatband voltages of high-k based p-type field effect transistors (pFETs) and n-type field effect transistors (nFETs) are difficult to control.

For instance, in conventional metal-oxide-semiconductor FETs (MOSFETs), the threshold voltage often fails to meet the desired value (e.g., ±0.3 V for both pFETs and nFETs). In some cases, electrode stacks are chosen according to work-function to provide the desired flatbands, but this often does not work. Moreover, threshold voltage shifts can vary significantly from desired values, and the causes for such shifts, which may be numerous, are not fully understood.

Thus, there is a need in the art for a method and apparatus for flatband voltage tuning of high-k field effect transistors.

SUMMARY OF THE INVENTION

In one embodiment, the invention is a method and apparatus for flatband voltage tuning of high-k field effect transistors. One embodiment of a field effect transistor includes a substrate, a high-k dielectric layer deposited on the substrate, a gate electrode deposited on the high-k dielectric layer, and a dipole layer positioned between the substrate and the gate electrode, for shifting the threshold voltage of the field effect transistor.

BRIEF DESCRIPTION OF THE DRAWINGS

So that the manner in which the above recited features of the present invention can be understood in detail, a more particular description of the invention, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the present invention is a method and apparatus for flatband voltage tuning of high-k field effect transistors (FETs). Embodiments of the invention introduce a dipole layer in the gate stack of a FET for threshold tuning. The dipole layer achieves voltage tuning in accordance with a simple rule based upon the electronegativity differences of the metal, oxygen (or nitrogen), and high-k dielectric components of the FET.

Figure 1:
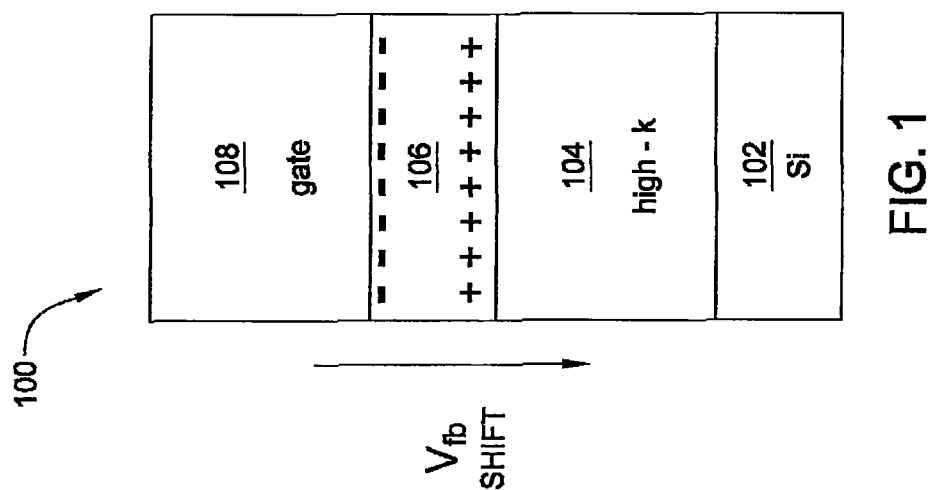
FIG. 1 is a schematic diagram illustrating a field effect transistor component of a complementary metal-oxide-semiconductor device, fabricated in accordance with a first embodiment of the present invention.

FIG. 1 is a schematic diagram illustrating a field effect transistor (FET) component 100 of a complementary metal-oxide-semiconductor (CMOS) device, fabricated in accordance with a first embodiment of the present invention. Specifically, the FET 100 is an nFET.

The FET 100 comprises a silicon substrate layer 102, a high-k dielectric layer 104, a dipole layer 106, and a gate electrode 108.

In one embodiment, the silicon substrate layer 102 includes a chemical oxidation (CHEMOX) layer deposited thereon. In one embodiment, the CHEMOX layer has a thickness of approximately 0.5 nm.

The high-k dielectric layer 104 is deposited on the silicon substrate layer 102. In one embodiment, the high-k dielectric layer 104 comprises hafnium oxide ($HfO_2$) or hafnium silicate (HfSiO). In one embodiment, the high-k dielectric layer 104 has a thickness of approximately two to approximately three nm.

The dipole layer 106 is deposited on the high-k dielectric layer 104. In one embodiment, the dipole layer 106 comprises an insulating material, such as a metal oxide or a metal nitride. As explained in greater detail below, the material that forms the dipole layer 106 is chosen to shift the threshold voltage of the FET 100 in a desired direction. In one embodiment, the dipole layer 106 has a thickness of approximately 0.3 to approximately two nm.

The gate electrode 108 is deposited on the dipole layer 106. In one embodiment, the gate electrode 108 comprises titanium nitride (TiN) having a layer of polysilicon deposited thereon. In an alternative embodiment, the gate electrode 108 comprises straight polysilicon.

Although the dipole layer 106 is illustrated as being positioned between the high-k dielectric layer 104 and the gate electrode 108, the dipole layer 106 may be positioned anywhere between the silicon channel and the point where gate bias is applied.

The dipole layer 106 functions as an electronegativity adjustment layer, defined by the shift parameter, γ. The shift parameter, γ, is further defined as:

$$\gamma = \left| \frac{\chi_g - \chi_d}{\chi_{h-k} - \chi_d} \right| \quad \text{(EQN. 1)}$$

where $\chi_g$ is the electronegativity of the gate electrode 108, $\chi_d$ is the electronegativity of the dipole layer 106, and $\chi_{h-k}$ is the electronegativity of the high-k dielectric layer 104.

For the dipole layer 106 of the nFET 100, the metal oxide or metal nitride comprising the dipole layer 106 satisfies the condition γ>1. As illustrated by the arrow $V_{fb}$ in FIG. 1, this results in the threshold voltage being shifted to a negative voltage.

Figure 2:
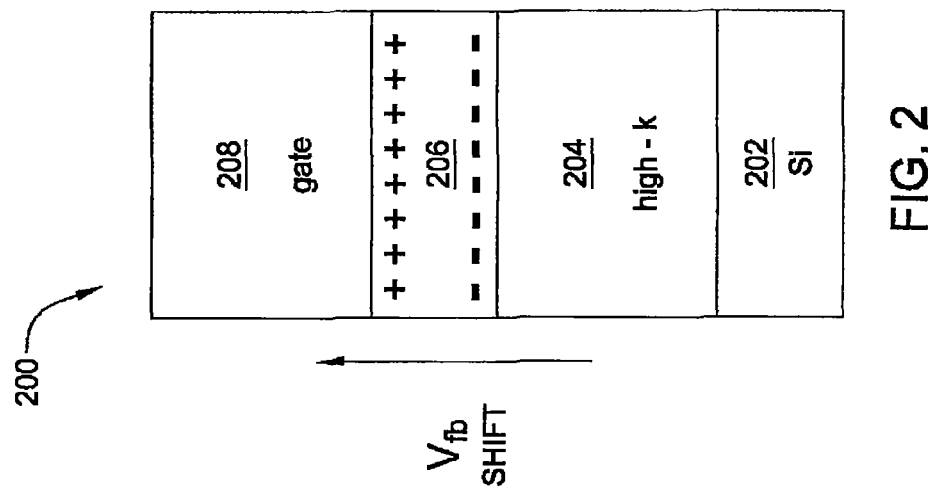
FIG. 2 is a schematic diagram illustrating a field effect transistor component of a complementary metal-oxide-semiconductor device, fabricated in accordance with a second embodiment of the present invention.

FIG. 2 is a schematic diagram illustrating a field effect transistor (FET) component 200 of a complementary metal-oxide-semiconductor (CMOS) device, fabricated in accordance with a second embodiment of the present invention. Specifically, the FET 200 is a pFET.

The FET 200 comprises a silicon substrate layer 202, a high-k dielectric layer 204, a dipole layer 206, and a gate electrode 208.

In one embodiment, the silicon substrate layer 202 includes a chemical oxidation (CHEMOX) layer deposited thereon. In one embodiment, the CHEMOX layer has a thickness of approximately 0.5 nm.

The high-k dielectric layer 204 is deposited on the silicon substrate layer 202. In one embodiment, the high-k dielectric layer 204 comprises hafnium oxide ($HfO_2$) or hafnium silicate (HfSiO). In one embodiment, the high-k dielectric layer 204 has a thickness of approximately two to approximately three nm.

The dipole layer 206 is deposited on the high-k dielectric layer 204. In one embodiment, the dipole layer 206 comprises an insulating material, such as a metal oxide or a metal nitride. As above, the material that forms the dipole layer 206 is chosen to shift the threshold voltage of the FET 200 in a desired direction. In one embodiment, the dipole layer 206 has a thickness of approximately 0.3 to approximately two nm.

The gate electrode 208 is deposited on the dipole layer 206. In one embodiment, the gate electrode 208 comprises titanium nitride (TiN) having a layer of polysilicon deposited thereon. In an alternative embodiment, the gate electrode 208 comprises straight polysilicon.

Although the dipole layer 206 is illustrated as being positioned between the high-k dielectric layer 204 and the gate electrode 208, the dipole layer 206 may be positioned anywhere between the silicon channel and the point where gate bias is applied.

For the dipole layer 206 of the pFET 200, the metal oxide or metal nitride comprising the dipole layer 206 satisfies the condition $\gamma<1$. In contrast to the dipole layer 106 illustrated in FIG. 1 (for which $\gamma>1$), this results in the threshold voltage being shifted to a positive voltage, as illustrated by the arrow $V_{fb}$ in FIG. 2.

Thus, the general rule with respect to the dipole layers 106 and 206 is that for metal oxides and metal nitrides that satisfy the condition $\gamma>1$, the threshold voltage will shift to negative voltages. These materials will therefore be used in nFET devices. For metal oxides and metal nitrides that satisfy the condition $\gamma<1$, the threshold voltage will shift to positive voltages. These materials will therefore be used in pFET devices.

Table 1 illustrates a list of metal oxides (and their associated electronegativities) that will satisfy this rule. In one embodiment, a FET according to the present invention uses any one or more of the metal oxides listed in Table 1 in the dipole layer.

TABLE 1

| Electronegativity (Pauling) | 0.9-1.1 | 1.1-1.2 | 1.3-1.4 | 1.5 | 1.6-1.8 |
|---|---|---|---|---|---|
| | $SrO_2$ | $Y_2O_3$ | $HfO_2$ | $Al_2O_3$ | $V_2O_3$ |
| | $La_2O_3$ | $CeO_2$ | $Sc_2O_3$ | AlN | $NbO_2$ |
| | LaN | MgO | $ZrO_2$ | $Ta_2O_5$ | ZnO |
| | CaO | $Pr_2O_3$ | | $TiO_2$ | $Ga_2O_3$ |
| | BaO | $SmO_2$ | | TiN | $GeO_2$ |
| | | $Eu_2O_3$ | | $MnO_2$ | $SiO_2$ |
| | | $Gd_2O_3$ | | | $RuO_2$ |
| | | $Er_2O_3$ | | | |
| | | $Yb_2O_3$ | | | |

The materials in the first two columns of Table 1 either have experimentally demonstrated or are expected to demonstrate negative flatband shifts, and therefore may be used in nFET devices in accordance with the present invention. Some of the materials in the fourth and fifth columns (i.e., $Al_2O_3$, AlN, $Ta_2O_5$, $MnO_2$, $V_2O_3$, $NbO_2$, $GeO_2$, and $SiO_2$) either have experimentally demonstrated or are expected to demonstrate positive flatband shifts, and therefore may be used in pFET devices in accordance with the present invention. Metal nitrides are expected to behave similarly if insulating.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for causing a flatband shift in a field effect transistor, comprising:
   providing a substrate;
   providing a high-k dielectric layer deposited on the substrate;
   providing a gate electrode deposited on the high-k dielectric layer;
   providing a dipole layer positioned directly between the high-k dielectric layer and the gate electrode; and
   shifting a threshold voltage of the field effect transistor such that the field effect transistor experiences the flatband shift, where a direction of the shifting is defined by a shift parameter of the dipole layer, and the shifting comprises:
   forming the dipole layer from a material that results in the shift parameter having a value greater than one when the field effect transistor is an n-type field effect transistor, causing the threshold voltage to shift to a negative voltage; and
   forming the dipole layer from a material that results in the shift parameter having a value less than one when the field effect transistor is a p-type field effect transistor, causing the threshold voltage to shift to a positive voltage.

2. The method of claim 1, wherein the dipole layer comprises a metal oxide.

3. The method of claim 1, wherein the shift parameter is defined by electronegativities of the high-k dielectric layer, the gate electrode, and the dipole layer.

4. The method of claim 3, wherein the shift parameter is approximately equal to a first quantity divided by a second quantity, the first quantity comprising an electronegativity of the gate electrode minus an electronegativity of the dipole layer, and the second quantity comprising an electronegativity of the high-k dielectric layer minus the electronegativity of the dipole layer.

5. The method of claim 1, wherein the dipole layer comprises a metal nitride.

6. The method of claim 1, wherein the material from which the dipole layer is formed comprises lanthanum oxide.

7. The method of claim 1, wherein the material from which the dipole layer is formed comprises lanthanum nitride.

8. The method of claim 1, wherein the material from which the dipole layer is formed comprises calcium oxide.

9. The method of claim 1, wherein the material from which the dipole layer is formed comprises zinc oxide.

10. The method of claim 1, wherein the material from which the dipole layer is formed comprises magnesium oxide.

11. The method of claim 1, wherein the material from which the dipole layer is formed comprises aluminum oxide.

12. The method of claim 1, wherein the material from which the dipole layer is formed comprises aluminum nitride.

13. The method of claim 1, wherein the material from which the dipole layer is formed comprises tantalum oxide.

14. The method of claim 1, wherein the material from which the dipole layer is formed comprises manganese oxide.

15. The method of claim 1, wherein the material from which the dipole layer is formed comprises germanium oxide.

16. The method of claim 1, wherein the material from which the dipole layer is formed comprises silicon oxide.

17. The method of claim 1, wherein the material from which the dipole layer is formed comprises titanium oxide.

18. The method of claim 1, wherein the material from which the dipole layer is formed comprises titanium nitride.

* * * * *